United States Patent [19] [11] 4,186,350
Takayama [45] Jan. 29, 1980

[54] ANTENNA TUNING CIRCUIT

[75] Inventor: Kazuo Takayama, Kobe, Japan

[73] Assignee: Fujitsu Ten Limited, Kobe, Japan

[21] Appl. No.: 895,963

[22] Filed: Apr. 13, 1978

[30] Foreign Application Priority Data

Apr. 19, 1977 [JP] Japan .................. 52-44695
Aug. 19, 1977 [JP] Japan ................. 52-100032
Aug. 19, 1977 [JP] Japan ................. 52-100033

[51] Int. Cl.² ........................................... H04B 1/10
[52] U.S. Cl. ................................. 325/383; 325/388; 325/454
[58] Field of Search ............... 325/454, 383, 388, 368, 325/385, 379, 365, 369, 371, 376, 377, 437; 343/745, 747; 334/15; 333/76

[56] References Cited
U.S. PATENT DOCUMENTS

| 2,026,075 | 12/1935 | Wheeler | 325/388 |
| 2,027,949 | 1/1936 | Yolles | 325/388 |
| 3,372,337 | 3/1968 | Beres | 325/388 |
| 3,626,300 | 8/1969 | Kennedy | 325/388 |
| 3,636,455 | 1/1972 | Miner et al. | 325/388 |

Primary Examiner—Robert L. Griffin
Assistant Examiner—Alexander Gerasimow
Attorney, Agent, or Firm—Oblon, Fisher, Spivak, McClelland & Maier

[57] ABSTRACT

An antenna tuning circuit of the type having a first variable capacitance diode connected in parallel with a coil to form a resonance circuit and a second variable capacitance diode through which the resonance circuit is connected to an antenna, in which the connection position of the first variable capacitance diode to the coil is adapted to be changed for the reduction in the image interference ratio. Reductions in the maximum capacitance and the ratio between the maximum capacitance and the minimum capacitance required for the variable capacitance diodes are also intended by the connection of a third variable capacitance diode to the antenna side of the second variable capacitance diode.

5 Claims, 14 Drawing Figures

ANTENNA TUNING CIRCUIT

BACKGROUND OF THE INVENTION

This invention relates to an antenna tuning circuit in electronic tuning type radio receivers.

In antenna tuning circuits for AM car receivers employing an electronic tuning system, a circuit as shown in FIG. 1 has been in use. In an equivalent circuit shown in FIG. 2, an antenna section ANT has an antenna capacitance $C_B$ of about 15 pF, and a cable capacitance $C_D$ of about 65 pF which, together with a capacitance of about 20–40 pF added in a receiver stage, form a great capacitance of about 100–120 pF. Since not sufficient capacitance varying ratio can be obtained in a tuning circuit consisting of a variable capacitor $C_1$ and an inductance L wherein a variable capacitance diode (hereinafter referred to as a varactor diode) is used as the variable capacitor in the tuning circuit because of the large capacitance connected in parallel with the inductance L on the antenna side, a circuit constitution as shown in the figures is employed wherein the same varactor diode as the diode $C_1$ is connected in series to the antenna.

In these figures, reference TR represents a radio frequency transformer having a winding ratio of 1:1 whose secondary coil is connected to a radio frequency amplifier RFA. In FIG. 2, $E_1$ represents electromotive force induced on the antenna. The variable capacitor $C_2$ which is the same as the variable capacitor $C_1$ in the tuning circuit is connected in series to the antenna for the equivalent decrease in the antenna capacity, taking S/N ratio into consideration. As apparent from FIG. 2, the antenna electromotive force $E_1$ is divided between the antenna capacitance $C_B$ and the cable capacitance $C_D$ and the resulted voltage is further divided between capacitors $C_2$ and $C_1$ and applied to the ratio frequency transformer TR. If the capacitor $C_2$ is a fixed one, the divided voltage changes with the variation in the capacitance of the capacitor $C_1$ wherein the voltage applied to the radio frequency transformer TR is decreased with the increase in the capacitance of the capacitor $C_1$ to worsen the S/N ratio. Changes in the capacitance of the capacitor $C_2$ along with those of the capacitor $C_1$ make the voltage divisional ratio and thus the S/N ratio constant.

Output voltage $E_2$ from the above antenna circuit is represented by the following equation and shown by the graph as in FIG. 3:

$$E_2 = E_1 \frac{P^2 LCC_B}{C + C_D + C_B + P^2L(C^2 + 2CC_B + 2CC_D)} \cdot \frac{1}{l} \quad (1)$$

wherein $P = j\omega$ and C is the capacitance of the capacitors $C_1$ and $C_2$. As can be seen from FIG. 3, while the output voltage $E_2$ arrives the peak at the resonance angular frequency $\omega_o$ and rapidly decreases thereafter, the voltage decrease is limited to a certain level, $E_{2s}$, below which no reduction is resulted no matter how the angular frequency increases. The resonance angular frequency $\omega_o$ and the above certain level $E_{2s}$ are represented by the equations:

$$\omega_o = \frac{1}{\sqrt{L \frac{C^2 + 2CC_D + 2CC_B}{C + C_D + C_B}}} \quad (2)$$

$$E_{2s} = \frac{E_1}{l} \cdot \frac{CC_B}{C^2 + 2C(C_B + C_D)} \quad (3)$$

If the output voltage $E_2$ is not decreased below a certain level beyond the resonance angular frequency, then the interference ratio will be considerably worsened unless a highly selective device is added to the tuning circuit at the radio frequency amplifying stage or the like.

SUMMARY OF THE INVENTION

It is, accordingly, an object of this invention to make improvements in the degradation of the above image interference ratio in the antenna tuning circuit in which two varactor diodes are used.

The total capacitance $C_{el}$ in FIG. 1 from the side of the radio frequency transformer TR to the antenna circuit is represented as:

$$C_{el} = \frac{C^2 + 2C(C_B + C_D)}{C_B + C_D + C} \quad (4)$$

and the receiving frequency $f_r$ in such an antenna tuning circuit is represented as:

$$f_r = \frac{1}{2\pi \sqrt{LC_{el}}} \text{ (Hz)} \quad (5)$$

In order to receive radiowaves in an AM broadcasting frequency band ranging from 525 kHz to 1605 kHz, the maximum capacitance $C_{elmax}$ and the minimum capacitance $C_{elmin}$ of the total capacitance $C_{el}$ have to satisfy the following equations:

$$\frac{1}{2\pi \sqrt{C_{elmax}L}} = 525 \times 10^3 \quad (6)$$

$$\frac{1}{2\pi \sqrt{C_{elmin}L}} = 1605 \times 10^3 \quad (7)$$

The capacitance $C_{el\,max}$ and $C_{el\,min}$ can be obtained respectively by substituting the value C in the equation (4) for the maximum value $C_{max}$ and the minimum value $C_{min}$ of the varactor elements respectively and represented by the following equations:

$$C_{elmax} = \frac{C_{max}^2 + 2C_{max}(C_B + C_D)}{C_B + C_D + C_{max}} \quad (8)$$

$$C_{elmin} = \frac{C_{min}^2 + 2C_{min}(C_B + C_D)}{C_B + C_D + C_{min}} \quad (9)$$

The above equations (6) to (9) can be combined and transformed as:

$$\frac{\frac{C_{max}^2 + 2(C_B + C_D)C_{max}}{C_B + C_D + C_{max}}}{\frac{C_{min}^2 + 2(C_B + C_D)C_{min}}{C_B + C_D + C_{min}}} \doteq 9.4 \quad (10)$$

Since the minimum capacitance value $C_{min}$ which can be obtained stably by a varactor diode is usually about 30 pF, its maximum capacitance value $C_{max}$ is calculated as $C_{max} = 420$ pF from the equation (10). Accordingly, the ratio between $C_{max}$ and $C_{min}$, that is, the capacitance varying ratio is given as:

$$C_{max}/C_{min} = 14.$$

Thus, the varactor diode is required to have a capacitance varying ratio of 14 and its maximum capacitance goes as high as 420 pF in the conventional circuit. It is, however, difficult to actually produce varactor diodes of such performance.

The second object of this invention is, accordingly, to provide a novel antenna tuning circuit capable of reducing the capacitance varying ratio and the maximum capacitance value required for the varactor diode.

Referring then to the signal to noise ratio S/N, it is an important factor in the antenna tuning circuit and the improvements in the image interference ratio and the capacitance ratio should not sacrifice the S/N ratio.

The third object of this invention is, accordingly, to make improvements in the S/N ratio.

According to this invention, in an antenna tuning circuit of an electronic tuning type radio receiver comprising a first varactor diode connected in parallel with a coil to form a resonance circuit and a second varactor diode which connects the coil to an antenna and whose capacitance is adjusted along with the capacitance of the first varactor diode, a parameter of the resonance circuit, for example, the position of a tap in the coil to which the first varactor diode is connected, that is, the coil winding ratio is adjusted so that a frequency corresponding to the minimum value of the output voltage from the tuning circuit may be coincided with an image frequency to be eliminated. The image interference ratio can thereby be minimized.

Also, in this invention, the second varactor diode is grounded on its antenna side through a third varactor diode, so as to permit the reduction in the said value $C_{max}$ and in the $C_{max}/C_{min}$ ratio.

Further, in this invention, the coil winding ratio is selected to less than one to thereby increase the S/N ratio.

BRIEF DESCRIPTION OF THE ACCOMPANYING DRAWINGS

This invention is to be described in more details referring to preferred embodiments shown in the accompanying drawings, in which FIG. 1 is a circuit diagram for a part of an antenna circuit used in conventional electronic tuning type radio receivers;

DESCRIPTION OF THE PREFERRED EMBODIMENTS

Figure 4:
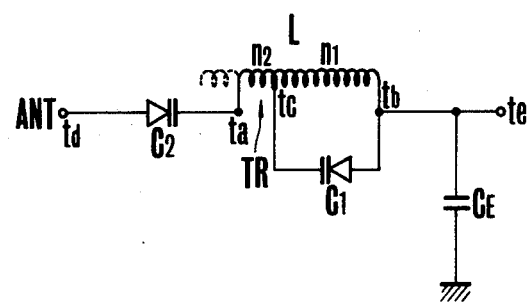
FIG. 4 is a circuit diagram showing a first embodiment of this invention.
Figure 5:
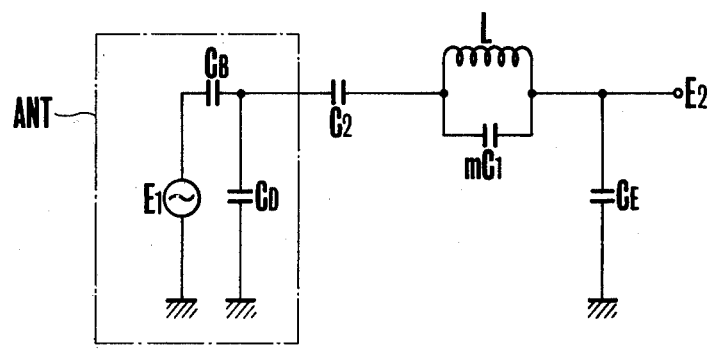
FIG. 5 is an equivalent circuit diagram for the circuit shown in FIG. 4.

Referring to FIG. 4, it shows a fundamental constitution of an antenna circuit according to this invention, in which $C_1$ and $C_2$ represent the above described varactor diodes and reference TR represents a coil which forms an auto-transformer having number of turns of $n_1 + n_2$ between terminals $t_a$ and $t_b$, that is, for the primary windings and number of turns of turns of $n_2$ between terminals $t_b$ and $t_c$, that is, for the secondary windings. The primary windings of the coil TR are connected in series with the varactor diode $C_2$ between an input terminal $t_d$ connected to an antenna ANT and an output terminal $t_e$ connected to a radio frequency amplifier RFA, and first varactor diode $C_1$ is connected between the coil terminals $t_c$ and $t_b$, that is, between both ends of the secondary windings. $C_E$ represents a capacitor having a relatively large capacitance and connected between the output terminal $t_e$ and the ground. The equivalent circuit for the above antenna circuit is shown in FIG. 5, in which L represents the inductance of the primary windings of the coil TR and m represents the winding ratio which is represented as:

$$m = \left( \frac{n_1}{n_1 + n_2} \right)^2.$$

Figure 1:
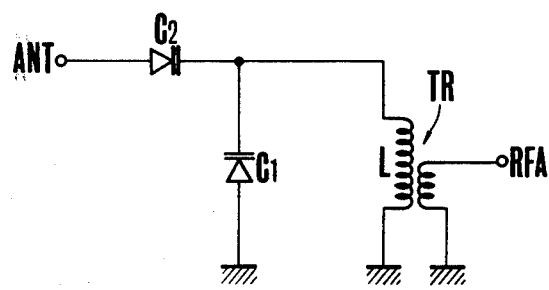

It will be apparent that the circuit in FIG. 4 is equivalent to that in FIG. 1 comprising $C_2$, $C_1$ and L by taking a particular notice on $C_2$, L and $mC_1$ while neglecting (short-circuitting) $C_E$ and it has a broadcast station selection function as well. Since the output is taken out from the inductance L in the circuit shown in FIG. 1, the output has to be taken out also from the inductance L in the circuit shown in FIG. 5 for the complete equivalency, but the output may be taken out across tha capacitor $C_E$ with the same effects and this gives a better result. Moreover, a trapping circuit composed of a $L - mC_1$ parallel circuit is formed in this circuit which contributes to the improvement in the image interference ratio. The output voltage $E_2$ from this circuit can be represented by the following equation (11) and graphically shown as in FIG. 6:

$$E_2 = E_1 \cdot \frac{CC_B + P^2LmC^2C_B}{C_E(C_B + C_D) + C(C_B + C_E + C_D) + P^2L[mC^2(C_B + C_D + C_E) + CC_E(1 + m)(C_B + C_D)]} \quad (11)$$

Figure 6:
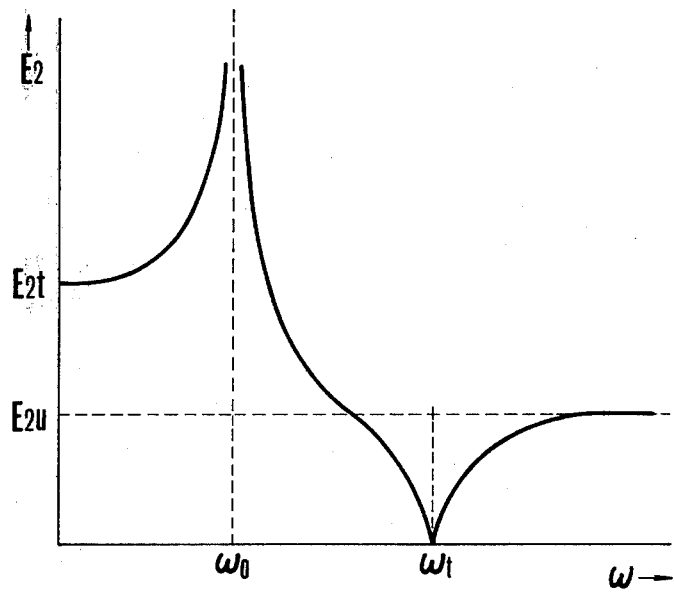
FIG. 6 is a graph for showing voltage characteristics in FIG. 4.

As apparent from FIG. 6, the output voltage $E_2$ from this circuit is $E_{2t}$ at an angular frequency $\omega=0$, arrives at its maximum value at a resonating frequency $\omega_O$, becomes minimum at a frequency $\omega_t$ and, thereafter, gradually approaches increasingly $E_{2u}$, where the angular frequency and the output voltage are represented as:

$$\omega_o = \frac{1}{\sqrt{L \cdot \frac{mC^2(C_B + C_D + C_E) + CC_E(1 + m)(C_B + C_D)}{C_E(C_B + C_D) + C(C_B + C_D + C_E)}}} \quad (12)$$

$$\omega_t = \frac{1}{\sqrt{LmC}} \quad (13)$$

$$E_{2t} = E_1 \cdot \frac{CC_B}{C_E(C_B + C_D) + C(C_B + C_D + C_E)} \quad (14)$$

$$E_{2u} = E_1 \cdot \frac{mC^2C_B}{mC^2(C_B + C_D + C_E) + CC_E(1 + m)(C_B + C_D)} \quad (15)$$

Considerable extent of improvements can be attained by setting a relation between the intermediate frequency $f_i$ of the radio receiver and the frequency $\omega_t$ as represented by the following equation (16), that is, setting the $\omega_t$ to image angular frequency:

$$(\omega_t - \omega_O)(1/2\pi = 2f_i,$$

i.e., $$\omega_t = \omega_O + 4\pi f_i \quad (16)$$

The angular frequency can readily be adjusted, as can be seen from the above equation (13), by selecting the winding ratio m, that is, by the change of the position for the tap $t_c$. Since the change of the tuned angular frequency $\omega_O$ for the selection of the broadcasting stations results in a difference between $(\omega_t - 107\ O)/2\pi$ and $2f_i$, it is desired to set the winding ratio m so that the equation (16) can be satisfied with a frequency at which the image interference is most injurious.

Figure 7:
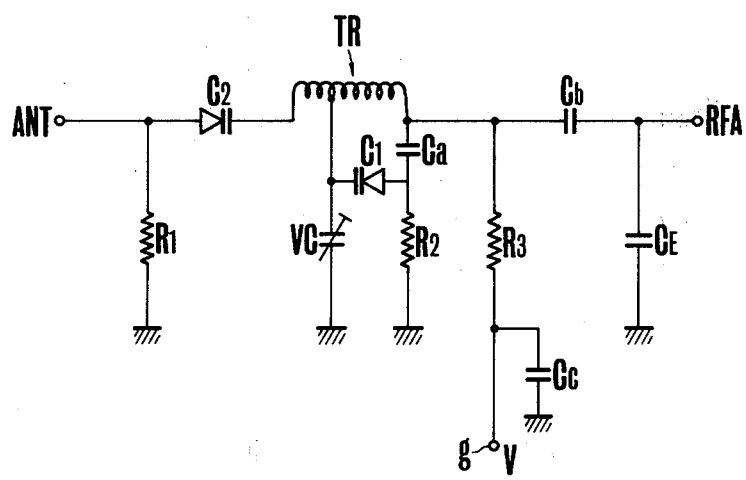
FIG. 7 is a circuit diagram showing one specific embodiment of FIG. 4.

FIG. 7 shows one specific embodiment of such an antenna circuit wherein are shown resistors $R_1$-$R_3$, capacitors $C_a$-$C_c$ and a variable capacitor VC for tracking adjustment, with other components being the same as those in FIG. 4. These resistors are employed for supplying a bias voltages to the varactor diodes. Upon application of a tuning operation voltage V to a terminal $t_g$, a voltage V is applied to the varactor diodes $C_1$ and $C_2$ through the route of: $R_3$-TR-$C_1R_2$ or $R_3$-TR-$C_2$-$R_1$ to vary their capacitances. In this instance, the respective elements may have the following values.

$R_1 = R_2 = R_3 = 200$ k$\Omega$
VC = 10 pF (max)
$C_a = 0.02$ $\mu$F
$C_b = C_c = 0.022$ $\mu$F
$C_1$, $C_2$ ... MVAM 125 (a product of Motorola Inc.)
TR = 200 $\mu$H
$C_E = 1000 \sim 2000$ pF According to this invention, a high quality broadcasting reception can be attained while suppressing the image interference in a simple means by providing the tuning circuit with a tap to which one of the varactor diodes is connected. The image interference frequency to be suppressed can be changed with ease by the change of the tap position. Adjustment for the tap position should of course be made so as to satisfy the foregoing equation (16). Then, depending on the case, the winding ratio may be selected as $m = 1$ where no tap is used or the $t_c$ is taken out from the end of additional windings supplemented to the coil of the transformer TR as shown in the dotted line. However, the winding ratio is usually set as $M < 1$.

Figure 8:
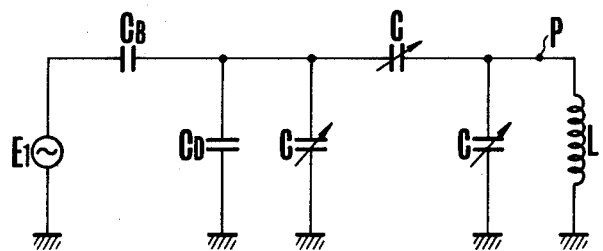
FIG. 8 is a circuit diagram showing one example of the antenna tuning circuit in which reduction in the $C_{max}/C_{min}$ ratio is intended.

The maximum capacitance $C_{max}$ and the capacitance ratio $C_{max}/C_{min}$ are great in the circuit in FIG. 1, and also in the circuit in FIG. 4, $C_{max}/C_{min}$ become great. FIG. 8 shows a circuit in which the above disadvantage is removed. As shown in the figure, this circuit consists of three varactor diodes arranged in a $\pi$-type connection circuit whose both ends are connected to the antenna capacitance $C_B$ and the inductance L. The total capacitance $C_{e2}$ in this circuit from the side of the inductance L to the antenna is represented as:

$$C_{e2} = \frac{3C^2 + 2C(C_B + C_D)}{C_B + C_D + 2C} \quad (17)$$

The maximum capacitance value $C_{max}$ of the varactor diode for tuning to the AM broadcasting frequency band ranging from 525 KHz to 1605 KHz in this circuit can be determined in this same way as foregoings in equations 6 through 10 and it is decided as $C_{max} = 330$ pF. Since the minimum capacitance $C_{min}$ is 30 pF, the varying ratio for the capacitance is represented as.

$$\frac{C_{max}}{C_{min}} = \frac{330\ (pF)}{30\ (pF)} = 11$$

It is apparent, when compared with the conventional circuit shown in FIG. 1, that both of the maximum capacitance value $C_{max}$ and the capacitance varying ratio $C_{max}/C_{min}$ required for the varactor diode can be reduced in the circuit shown in FIG. 8 and hence the circuit can actually be constituted with ease.

Figure 9:
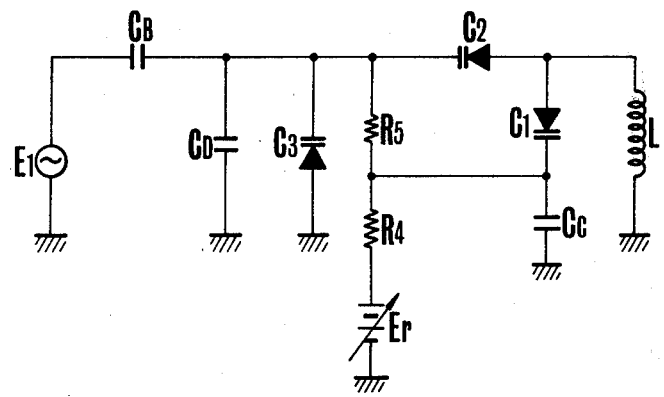
FIG. 9 is a circuit diagram showing one specific embodiment of FIG. 8.

FIG. 9 shows a circuit diagram which specifically shows the circuit in FIG. 8, in particular, with respect to the varactor diodes. As shown in the figure, three varactor diodes $C_1$-$C_3$ in a $\pi$ connection are connected at their anodes with a variable voltage source Er for tuning use by way of resistors $R_4$ and $R_5$, so that the capacitance value for each of the above diodes can optionally be varied as required. Capacitor Cc is inserted for the elimination of noises from the voltage source. In this instance, the respective elements may have the following values:

| | |
|---|---|
| $R_4 = 10\ K\Omega$ | $L = 150\ \mu F$ |
| $R_5 = 200\ K\Omega$ | $C_1, C_2, C_3$ MVAM 125 |
| $C_c = 0.22\ \mu F$ | |

The circuit shown in FIG. 8 is, however, disadvantageous in that the signal to noise ratio S/N therein is low, which is to be described below. In order to determine the S/N ratio in the circuit shown in FIG. 8, the signal voltage Eo at point P under resonance state is determined as:

$$Eo = \frac{C_B C Q}{3C^2 + 2C(C_B + C_D)} E_1 \qquad (18)$$

where Q is a quality factor for the coil of the radio frequency transformer, and it is represented as: $Q = \omega_0 L/r$ in which $\omega_0$ is a resonance frequency and r is a resistance loss in the coil.

Assuming that the noises generated at the point P are caused by thermal noises due to the resistance loss in the coil, the electromotive force of the thermal noises generated through the coil resistance r is represented as:

$$V_N = \sqrt{4kTBr} = \sqrt{\frac{4k}{\omega_0 C_{e2} Q}} \qquad (19)$$

where k is a Boltzmann's constant, T is an absolute temperature and B is a band width. Since the above thermal electromotive force $V_N$ is multiplied by a factor of Q at the point P under the resonance state, the noise voltage N at the point P can be represented as:

$$N = \sqrt{\frac{4kTB}{\omega_0 C_{e2} Q}} \cdot Q \qquad (20)$$

Accordingly, the signal to noise ratio S/N in the antenna tuning circuit in FIG. 8 is represented as:

$$S/N = \frac{C_B C \sqrt{\omega_0 Q} \cdot E_1}{\sqrt{[3C^2 + 2C(C_B + C_D)][4kTB(C_B + C_D + 2C)]}} \qquad (21)$$

Figure 10:
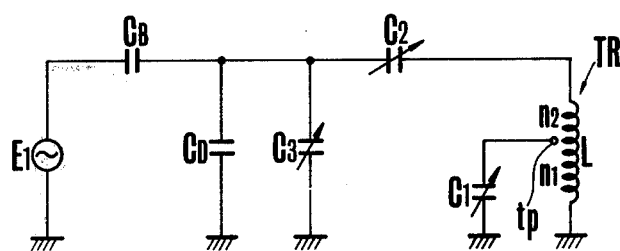
FIG. 10 is a circuit diagram showing one example of the antenna tuning circuit in which the reduction in the S/N ratio is intended.
Figure 11:
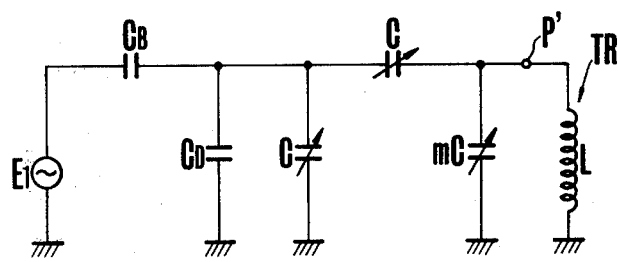
FIG. 11 is an equivalent circuit diagram for the circuit in FIG. 10

Substitution of the above equation, for example, with the following typical specific values:
$k = 1.38 \times 10^{-23}$ (J/°K.). $T = 298$ (°K.).
$B = 3 \times 10^3 (Hz)$
$C_a = 15 (pF)$. $C_a + C_b = 120$ (pF). $C = 100 (pF)$. $\omega_0 = 2\pi \times 10^6 (Hz)$
$Q = 100$.
gives a S/N ratio of 35.5 dB, which is, however, insufficient in a practical point of view. FIG. 10 shows an antenna tuning circuit which provides an improvement in this regard. The coil TR is formed with a tap Tp so as to give a winding ratio $n_1 = n_2$ to which the varactor diode $C_1$ is connected. The equivalent circuit for the determination of the S/N ratio of the circuit shown in FIG. 10 is as shown in FIG. 11. The signal voltage Eo' at point P' under the resonance state is represented as:

$$Eo' = \frac{CC_B Q E_1}{C^2(1 + 2m) + C(1 + m)(C_B + C_D)} \qquad (22)$$

where $$m = \left(\frac{n_1}{n_1 + n_2}\right)^2 \leq 1.$$

Meanwhile, the noise voltage N due to the thermal electromotive force $V_N$ resulted from the thermal noises caused by the resistance loss r of the coil T can be represented, as foregoings, as:

$$N = \sqrt{\frac{4kTB}{\omega_0 C_{e3} Q}} \cdot Q \qquad (23)$$

In the equation above, $C_{e3}$ is the total capacitance from the side of the coil TR to the antenna in the circuit shown in FIG. 10 and it is represented by the following equation:

$$C_{e3} = \frac{C^2(1 + 2m) + C(1 + m)(C_B + C_D)}{C_B + C_D + 2C} \qquad (24)$$

Accordingly, the signal to noise ratio S/N in this circuit is represented as:

$$S/N = \frac{Eo'}{N} = \frac{CC_B \sqrt{\omega_0 Q} \cdot E_1}{\sqrt{[C^2(1 + 2m) + C(1 + m)(C_B + C_D)][4kTB(C_B + C_D + 2C)]}} \qquad (25)$$

In the range of $m \leq 1$, the above S/N ratio is minimized at $m = 1$. Since the circuit corresponds to the circuit shown in FIG. 8 where $m = 1$, the improvement in the S/N ratio can be attained by dividing the winding of the tuning coil TR using a tap so as to provide a ratio $m > 1$.

Reference will now be made for showing that the maximum capacitance value $C_{max}$ and the capacitance varying ratio $C_{max}/C_{min}$ required for the varactor diode in the antenna tuning circuit shown in FIG. 10 are approximately the same as those in the circuit of FIG. 8. Considering that the total capacitance $C_{e4}$ from the side of the coil TR to the antenna in the circuit shown in FIG. 11 is represented as:

$$C_{e4} \frac{C^2(1 + 2m) + C(1 + m)(C_B + C_D)}{C_B + C_D + 2C} \qquad (26)$$

and also referring to the foregoing equations (6)–(9), the following equation can be induced in the same procedures:

$$\frac{\frac{C_{max}^2(1 + 2m) + C_{max}(1 + m)(C_B + C_D)}{C_B + C_D + 2C_{max}}}{\frac{C_{min}^2(1 + 2m) + C_{min}(1 + m)(C_B + C_D)}{C_B + C_D + 2C_{min}}} = 9.4 \qquad (27)$$

Assuming in the same way as in the foregoing cases that $C_{min} = 30$ pF and $C_B + C_D = 120$ pF, the capacitance varying ratios $C_{max}/C_{min}$ are 11 and 11.6 for the value of m, for example, 1 and 0.5 respectively. As stated already, the circuit with m=1 corresponds to that in FIG. 8 and the circuit with m≦1 corresponds to that in FIG. 10. The capacitance varying ratios in these circuits can therefore be considered substantially equal to each other.

Figure 12:
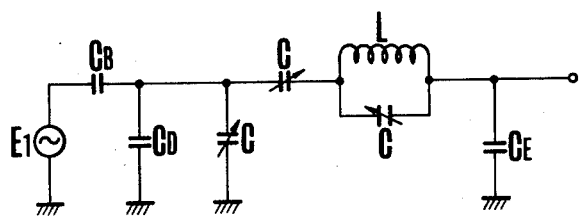
FIG. 12 and FIG. 13 are circuit diagrams respectively showing second and third embodiments of this invention.
Figure 13:
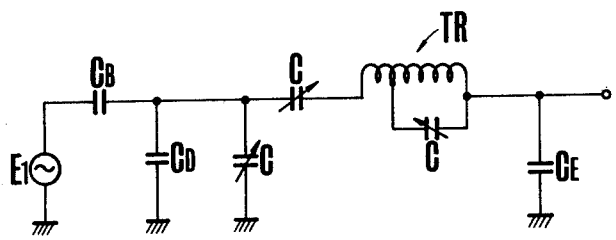

Improvements in the image interference ratio in the circuit shown in FIG. 8 and FIG. 10 can be attained by the circuit constructions shown in FIG. 12 and FIG. 13, whereby an antenna tuning circuit with low image interference ratio can be obtained notwithstanding the use of varactor diodes having a comparatively small capacitance varying ratio.

Figure 14:
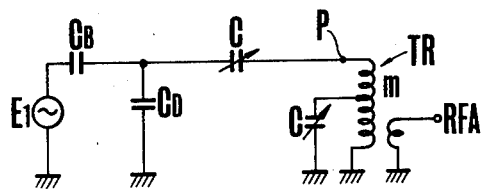
FIG. 14 is a circuit diagram used for the calculation of the S/N ratio in the circuits in FIG. 4.

FIG. 14 shows a circuit wherein the capacitor $C_E$ in FIG. 4 is eliminated and the output is obtained from the transformer TR in FIG. 4. The S/N ratio in this circuit can be determined in the following manner. Voltage Eo at point P under the resonance state is represented as:

$$Eo = \frac{CC_B Q E_1}{mC^2 + C(1+m)(C_B + C_D)} \tag{28}$$

The noise voltage N due to the thermal electromotive force Vn resulted from the thermal noises by the resistance loss in the coil of the transformer TR is represented as:

$$N = \sqrt{\frac{4kTB}{\omega_o C_{e3} Q}} \cdot Q \tag{29}$$

where $C_{e3}$ is the total capacitance viewed from the side of the transformer TR to antenna in FIG. 14 and represented by the following equation:

$$C_{e3} = \frac{mC^2 + C(1+m)(C_B + C_D)}{C_B + C_D + C} \tag{30}$$

Accordingly, the S/N ratio in this circuit is represented as:

$$\frac{S}{N} = \frac{CC_B \sqrt{\omega_o Q}\, E_1}{\sqrt{[mC^2 + C(1+m)(C_B + C_D)][4kTB(C_B + C_D + C)]}} \tag{31}$$

Figure 2:
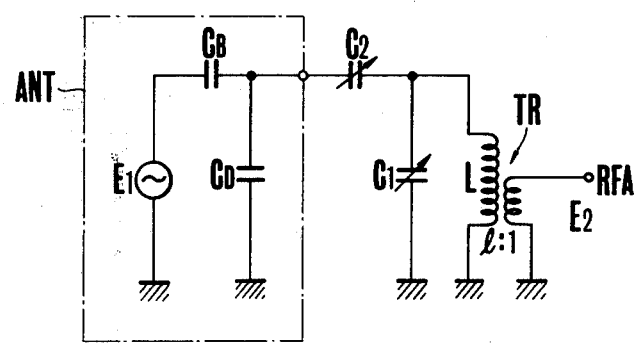
FIG. 2 is an equivalent circuit diagram for the circuit in FIG. 1.
Figure 3:
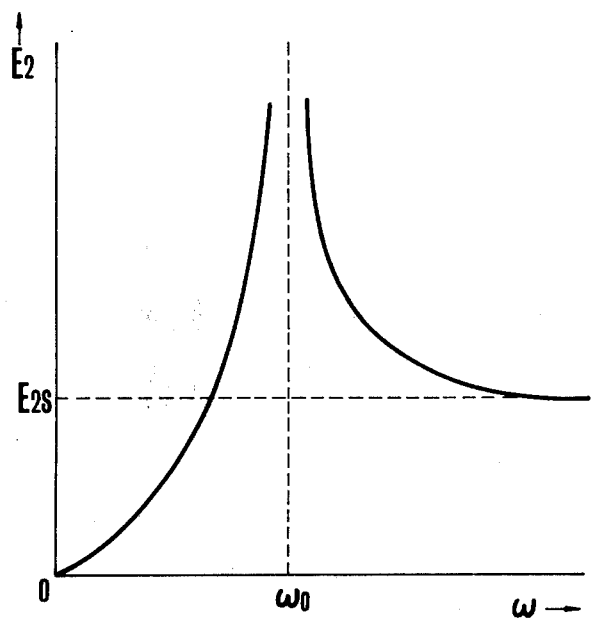
FIG. 3 is a graph showing the output voltage characteristic in FIG. 1.

The same calculation for the conventional circuit in FIG. 2, gives the voltage Eo on the side of the capacitor $C_2$ of the transformer TR as:

$$Eo = \frac{C_B C Q}{C^2 + 2C(C_B + C_D)} E_1 \tag{32}$$

The electromotive force Vn due to the thermal noises is calculated as:

$$Vn = \sqrt{4kTB_r} = \sqrt{\frac{4kTB}{\omega_o C_{e2} Q}} \tag{33}$$

Since the above thermal electromotive force Vn is multiplied by a factor Q at the point P under the resonance state, the noise voltage N at the point P is represented as:

$$N = \sqrt{\frac{4kTB}{\omega_o C_{e2} Q}} \cdot Q \tag{34}$$

Accordingly, the S/N ratio in the circuit of FIG. 14 is represented as:

$$S/N = \frac{C_B C \sqrt{\omega_o Q}\, E_1}{\sqrt{[C^2 + 2C(C_B + C_D)] \cdot 4kTB(C_B + C_D + C)}} \tag{35}$$

The ratio between the S/N ratio in the equation (31):(S/N)a and the S/N ratio in the equation (35):(S/N)b represented as:

$$(S/N)a/(S/N)b = \frac{C^2 + 2C(C_B + C_D)}{mC^2 + C(1+m)(C_B + C_D)} \tag{36}$$

Then, (S/N)a>(S/N)b if m<1 and the circuit shown in FIG. 14 is, therefore, improved as compared with circuit of FIG. 2.

As specifically described above, according to this invention, improvements can be attained by very simple means in the image interference ratio, decreases in the $C_{max}$ and $C_{max}/C_{min}$ ratio, as well as increase in the S/N ratio.

What is claimed is:

1. An antenna tuning circuit of an electronic tuning type radio receiver having a first variable capacitance diode connected in parallel with a coil to form a resonance circuit and a second variable capacitance diode which connects the coil to an antenna and whose capacitance value is adjusted in company with the capacitance value of the first variable capacitance diode, wherein one end of said coil is grounded together with one end of said first variable capacitance diode by way of a capacitor having a relatively large capacitance, a tuned voltage is taken out from both ends of said capacitor, the other end of said coil is connected by way of said second variable capacitance diode to the antenna, and the parameter of said resonance circuit is selected in such a way that a frequency corresponding to the minimum value of the tuned voltage coincides with an image frequency to be eliminated.

2. The antenna tuning circuit of claim 1, wherein said coil is provided with a tap, said first variable capacitance diode is connected between the tap and one end of said coil, and the other end of said coil is connected by way of said second variable capacitance diode to the antenna.

3. The first antenna tuning circuit of claim 2, wherein the other end of said coil is connected to the antenna by way of said second variable capacitance diode and the antenna side of the second variable capacitance diode is grounded to the earth by way of a third variable capacitance diode whose capacitance value is adjusted along with the capacitance values of said first and second variable capacitance diodes.

4. The antenna tuning circuit of claim 3, wherein the winding ratio of said coil determined by the position of said tap is smaller than one.

5. The antenna tuning circuit of claim 1, wherein the other ends of said coil and said first variable capacitance diode are connected to the antenna by way of said second variable capacitance diode and the antenna side of the second variable capacitance diode is grounded to the earth by way of said third variable capacitance diode whose capacitance value is adjusted together with the capacitance values of said first and second variable capacitance diodes.

* * * * *

UNITED STATES PATENT AND TRADEMARK OFFICE
CERTIFICATE OF CORRECTION

PATENT NO. : 4,186,350
DATED : January 29, 1980
INVENTOR(S) : KAZUO TAKAYAMA

It is certified that error appears in the above-identified patent and that said Letters Patent are hereby corrected as shown below:

Column 1, line 29,
    change "1 : 1"
    to -- $\ell$ : 1--;

Column 1, line 41,
    replace "ratio frequency"
    by --radio frequency--;

Column 4, line 7,
    replace "$C_{max}/C_{min}$ ratio is intended;" (italicized)
    by --$C_{max}/C_{min}$ ratio is intended;--;

Column 4, line 31,
    replace "number of turns of turns of $n_2$ between"
    by --number of turns of $n_2$ between--;

Column 5, line 30,
    replace "$(\omega_t - \omega_o)$ $(1/2\pi = 2 f_\ell$"
    by --$(\omega_t - \omega_o)$ $(1/2\pi) = 2f_i$--;

Column 5, line 41,
    replace "$(\omega_t - 107_o)$ $2\pi$"
    by --$(\omega_t - \omega_o)$ $/2\pi$--;

Column 5, line 53,
    replace "$R_3 - TR - C_1R_2$"

UNITED STATES PATENT AND TRADEMARK OFFICE
CERTIFICATE OF CORRECTION

PATENT NO. : 4,186,350
DATED : January 29, 1980
INVENTOR(S) : Kazuo Takayama

It is certified that error appears in the above—identified patent and that said Letters Patent is hereby corrected as shown below:

by --$R_3 - TR - C_1 - R_2$--;

Column 7, line 7,
replace "$C_1, C_2 \ C_3$"
by --$C_1, C_2, C_3$--;

Column 7, line 30, change "$V_N = \sqrt{4kTBr} = \sqrt{\dfrac{4k}{\omega_0 C_{e2} \ Q}}$"

to --$V_N = \sqrt{4kTBr} = \sqrt{\dfrac{4kTB}{\omega_0 C_{e2} \ Q}}$ --;

Column 7, line 60,
change "(pF)" in the first occurrence
to --(pF)-- as in the second occurrence;

UNITED STATES PATENT AND TRADEMARK OFFICE
CERTIFICATE OF CORRECTION

PATENT NO. : 4,186,350

DATED : January 29, 1980

INVENTOR(S) : Kazuo Takayama

It is certified that error appears in the above—identified patent and that said Letters Patent is hereby corrected as shown below:

Column 9, line 30, change "$N = \sqrt{\dfrac{1}{4kTB} \overline{\omega_o C_{e3} Q}} \cdot Q$"

to --$N = \sqrt{\dfrac{4kTB}{\omega_o C_{e3} Q}} \cdot Q$--.

Signed and Sealed this

Eleventh Day of November 1980

[SEAL]

Attest:

SIDNEY A. DIAMOND

Attesting Officer

Commissioner of Patents and Trademarks